(12) United States Patent
Otremba et al.

(10) Patent No.: US 8,970,032 B2
(45) Date of Patent: Mar. 3, 2015

(54) CHIP MODULE AND METHOD FOR FABRICATING A CHIP MODULE

(75) Inventors: Ralf Otremba, Kaufbeuren (DE); Josef Hoeglauer, Heimstetten (DE); Martin Standing, Villach (AT)

(73) Assignee: Infineon Technologies AG, Neubiberg (DE)

( * ) Notice: Subject to any disclaimer, the term of this patent is extended or adjusted under 35 U.S.C. 154(b) by 179 days.

(21) Appl. No.: 13/239,059

(22) Filed: Sep. 21, 2011

(65) Prior Publication Data
US 2013/0069243 A1    Mar. 21, 2013

(51) Int. Cl.
| | | |
|---|---|---|
| H01L 23/48 | (2006.01) | |
| H01L 23/495 | (2006.01) | |
| H01L 23/00 | (2006.01) | |
| H01L 23/31 | (2006.01) | |
| H01L 21/56 | (2006.01) | |
| H01L 23/492 | (2006.01) | |

(52) U.S. Cl.
CPC .......... *H01L 23/49562* (2013.01); *H01L 24/19* (2013.01); *H01L 24/97* (2013.01); *H01L 23/3107* (2013.01); *H01L 21/561* (2013.01); *H01L 23/492* (2013.01); *H01L 23/49517* (2013.01); *H01L 2224/04105* (2013.01); *H01L 2224/32245* (2013.01); *H01L 2224/73267* (2013.01); *H01L 2224/92244* (2013.01); *H01L 2924/13055* (2013.01)
USPC ............................ 257/735; 257/778; 257/779

(58) Field of Classification Search
USPC ......... 257/668, 735, 778, 779, 782, 783, 666, 257/673, 676, 690, 692, 696, 688, 689, 727
See application file for complete search history.

(56) References Cited

U.S. PATENT DOCUMENTS

| | | | |
|---|---|---|---|
| 5,898,651 A | 4/1999 | Furusawa | |
| 7,408,251 B2 * | 8/2008 | Hata et al. ..................... | 257/678 |
| 7,662,726 B2 * | 2/2010 | Mahler et al. ................. | 438/758 |
| 7,759,772 B2 | 7/2010 | Leong et al. | |
| 8,519,526 B2 * | 8/2013 | Huang et al. .................. | 257/692 |
| 2007/0252251 A1 | 11/2007 | Sun et al. | |
| 2008/0251903 A1 * | 10/2008 | Otremba et al. .............. | 257/678 |
| 2008/0265396 A1 | 10/2008 | Maloney et al. | |
| 2010/0044842 A1 * | 2/2010 | Mengel et al. ................ | 257/676 |
| 2011/0042812 A1 | 2/2011 | Kayukawa et al. | |

FOREIGN PATENT DOCUMENTS

| | | |
|---|---|---|
| DE | 102007017831 A1 | 10/2008 |
| DE | 102010039148 A1 | 2/2011 |

* cited by examiner

*Primary Examiner* — Matthew W Such
*Assistant Examiner* — Ali Naraghi
(74) *Attorney, Agent, or Firm* — Slater & Matsil, L.L.P.

(57) ABSTRACT

The chip module includes a semiconductor chip having a first contact element on a first main face and a second contact element on a second main face. The semiconductor chip is arranged on a corner in such a way that the first main face of the semiconductor chip faces the carrier. One or more electrical connectors are connected to the carrier and include end faces located in a plane above a plane of the second main face of the semiconductor chip.

18 Claims, 5 Drawing Sheets

CHIP MODULE AND METHOD FOR FABRICATING A CHIP MODULE

TECHNICAL FIELD

The present invention relates to a chip module and a method for fabricating a chip module.

BACKGROUND

In a chip module a semiconductor chip is arranged on a carrier and contact elements of the semiconductor chip can be arranged on both main surfaces thereof. The contact elements of the semiconductor chip have to be connected with outer electrical contact areas of the module so that the module can be arranged on an electronic board such as, for example, a printed circuit board (PCB).

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
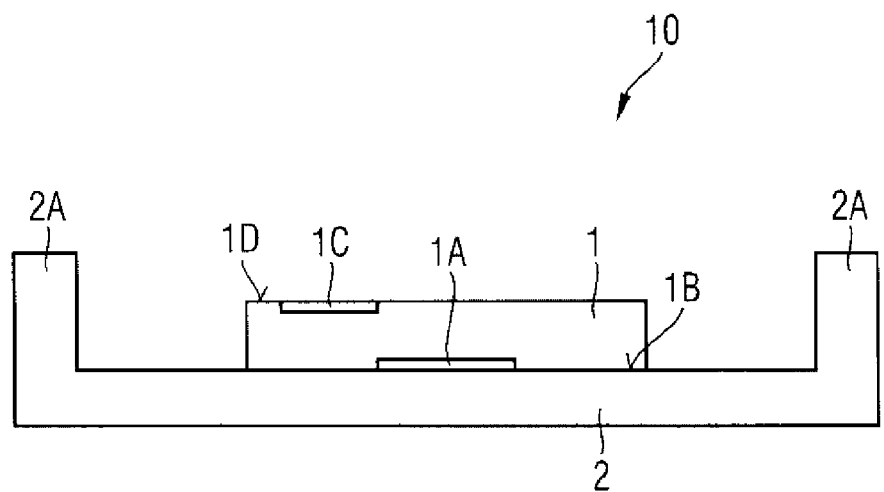
FIG. 1 shows a schematic cross-sectional side view representation of a chip module according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a chip module and a method for fabricating a chip module may use various types of semiconductor chips or circuits incorporated in the semiconductor chips, among them logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures such as, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole such as, for example, laminating techniques as well as techniques in which layers are deposited in a sequential manner such as, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

In the claims and in the following description different embodiments of a method for fabricating a semiconductor chip or an electronic device are described as a particular sequence of processes or measures, in particular in the flow diagrams. It is to be noted that the embodiments should not be limited to the particular sequence described. Particular ones or all of the different processes or measures can also be conducted simultaneously or in any other useful and appropriate sequence.

The chip modules as described in this application comprise a carrier. The carrier may comprise or consist of any sort of electrically conducting material as, for example, copper or copper alloy or iron/nickel alloy. The carrier can be connected mechanically and electrically with one contact element of the semiconductor chip. The semiconductor chip can be connected to the carrier by one or more of re-flow soldering, vacuum soldering, diffusion soldering, or adhering by means of a conductive adhesive. If diffusion soldering is used as the connection technology between the semiconductor chip and the carrier, solder materials can be used which result in intermetallic phases at the interface between the semiconductor and the carrier due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip is to be adhered to the carrier, conductive adhesives can be used. The adhesives can, for example, be based on epoxy resins which can be enriched with particles of gold, silver, nickel or copper to enhance their electrical conductivity.

The contact elements of the semiconductor chip may comprise a diffusion barrier. The diffusion barrier prevents in case of diffusion soldering that the solder material diffuses from the carrier in the semiconductor chip. A thin titanium layer on the contact element may, for example, affect such a diffusion barrier.

Referring to FIG. 1, there is shown a schematic cross-sectional side view representation of a chip module according to an embodiment. A chip module 10 according to FIG. 1 comprises a semiconductor chip 1 having a first contact element 1A on a first main face 1B and a second contact element 1C on a second main face 1D, a carrier 2 on which the semiconductor chip 1 is arranged in such a way that the first main face 1B of the semiconductor chip 1 faces the carrier 2, and one or more electrical connectors 2A which are connected to the carrier 2 and which comprise end faces located in a plane above a plane of the second main face 1D of the semiconductor chip 1.

According to an embodiment of the chip module 10 of FIG. 1, the one or more electrical connectors 2A are contiguous with the carrier 2. In particular, they can be formed by bending upwards the respective end portions of the carrier 2. According to an embodiment the one or more electrical connectors 2A can be made of the same material as the carrier 2.

According to an embodiment of the chip module 10 of FIG. 1, the one or more electrical connectors 2A each comprise an end face which is situated in a plane parallel with the first and second main faces 1B and 1D of the semiconductor chip 1. A somewhat more detailed embodiment will be set out later.

According to an embodiment of the chip module 10 of FIG. 1, the module comprises an even number of electrical conductors connected to two opposing side faces of the carrier 2 in a symmetrical manner. In particular, the module 10 may comprise two electrical connectors on respective two opposing side faces of the carrier 2.

According to an embodiment of the chip module 10 of FIG. 1, the module further comprises an insulation layer (not shown) covering the second main face 1D of the semiconductor chip 1. According to an embodiment thereof, an electrical through-connector is formed in the insulation layer which extends through the insulation layer and which is connected mechanically and electrically to the second contact element 1C of the semiconductor chip 1. The electrical through-connector may be formed in such a way that it comprises an exposed upper surface above or coplanar with the upper surface of the insulation layer, wherein the exposed upper surface can be coplanar with upper end faces of the one or more electrical connectors 2A of the carrier 2.

According to an embodiment of the chip module 10, the insulation layer also covers the carrier 2. In particular, the insulation layer covers the second main face 1D of the semiconductor chip 1, at least two opposing side faces of the semiconductor chip 1 and portions of the carrier 2 which are situated adjacent to the opposing side faces of the semiconductor chip 1.

Figure 2:
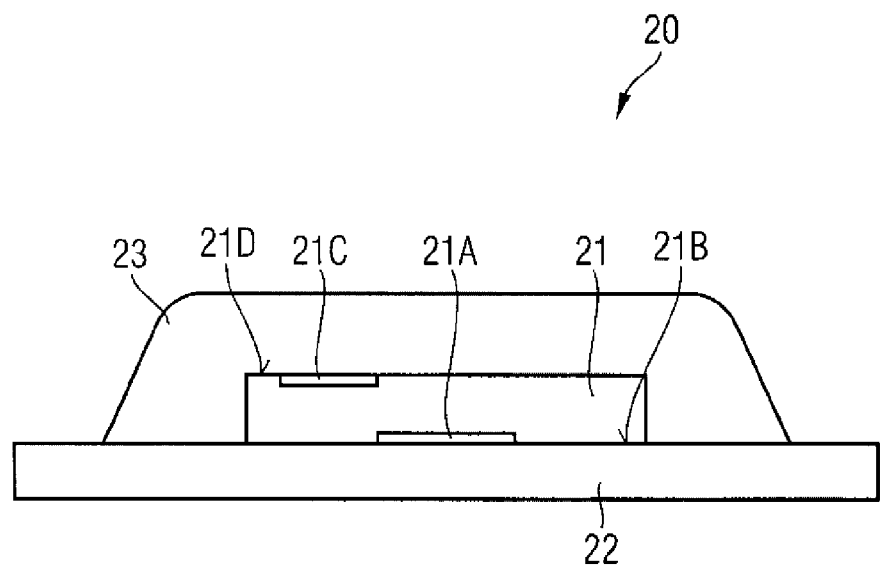
FIG. 2 shows a schematic cross-sectional side view representation of a chip module according to an embodiment.

Referring to FIG. 2, there is shown a schematic cross-sectional side view representation of a chip module according to an embodiment. The chip module 20 of FIG. 2 comprises a semiconductor chip 21 having a first contact element 21A on a first main face 21B and a second contact element 21C on a second main face 21D, a carrier 22 on which the semiconductor chip 21 is arranged in such a way that the first main face 21B of the semiconductor chip 21 faces the carrier 22, and an insulation layer 23 covering the second main face 21D of the semiconductor chip 21 and the carrier 22.

According to an embodiment of the chip module 20 of FIG. 2, the insulation layer 23 covers portions of the carrier 22 adjacent to two opposing side faces of the semiconductor chip 21. More specifically, the insulation layer 23 covers the second main face 21D of the semiconductor chip 21, two opposing side faces of the semiconductor chip 21 and portions of the upper surface of the carrier 22 which are situated adjacent to the two opposing side faces of the semiconductor chip 21.

According to an embodiment of the chip module 20 of FIG. 2, the insulation layer 23 covers the second main face 21D and all four side faces of the semiconductor chip 21 as well as portions of the upper surface of the carrier adjacent to all four side faces of the semiconductor chip 21.

According to an embodiment of the chip module 20 of FIG. 2, the module further comprises an electrical through-connector (not shown) formed in the insulation layer 23 in such a way that it is mechanically and electrically connected to the second contact element 21C of the semiconductor chip 21 and extends through the insulation layer 23 to an upper surface of the insulation layer 23. In particular, the electrical through-connector comprises an upper exposed surface situated in a horizontal plane above or coplanar with an upper surface of the insulation layer and parallel to the main faces of the semiconductor chip 21.

According to an embodiment of the chip module 20 of FIG. 2, the module further comprises one or more electrical connectors (not shown) which are connected to the carrier 22 and which comprise end faces located in a plane above a plane of the second main face 21D of the semiconductor chip 21. According to an embodiment thereof, the one or more electrical connectors each comprise upper horizontal end faces which are coplanar with the upper exposed surface of the electrical through-connector formed in the insulation layer.

According to an embodiment, the one or more electrical connectors are formed contiguous with the carrier and/or are made of the same material as the carrier. In particular, the one or more electrical connectors can be formed by bending up end portions of the carrier in a direction towards the second main face 21D of the semiconductor chip 21.

According to one embodiment of the chip module 20 of FIG. 2, the insulation layer 23 is comprised of a solder mask layer, i.e., made of a material which is typically used as a solder mask layer in the technological area concerned herewith. The insulation layer 23 can be fabricated of a photo-structurable material like, for example, a photoresist. The insulation layer 23 can also be fabricated of any sort of polymer material like a polyimide material.

Figure 3:
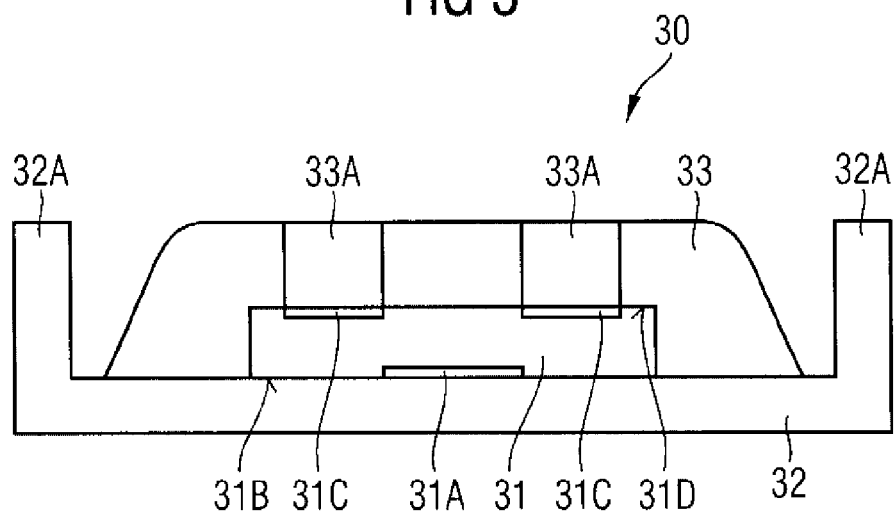
FIG. 3 shows a schematic cross-sectional side view representation of a chip module according to an embodiment.

Referring to FIG. 3, there is shown a schematic cross-sectional side view representation of a chip module according to an embodiment. The chip module 30 of FIG. 3 comprises a semiconductor chip 31 having a first contact element 31A on a first main face 31B and second contact elements 31C on a second main face 31D. The semiconductor chip 31 is arranged on a carrier 32 in such a way that the first main face 31B of the semiconductor chip 31 faces the carrier 32. The carrier 32 comprises one or more electrical connectors 32A which are connected to the carrier 32 and which comprise end faces located in a plane above a plane of the second main face 31D of the semiconductor chip 31. The chip module 30 further comprises an insulation layer 33 covering the second main face 31D of the semiconductor chip 31 and also covering the carrier 32. The insulation layer 33 comprises electrical through-connectors 33A each one of which being mechanically and electrically connected to one of the second contact elements 31C of the semiconductor chip 31. The electrical through-connectors 33A extend through the insulation layer 33 and comprise upper exposed surfaces situated in a plane coplanar with upper end faces of the electrical connectors 32A of the carrier 32.

Further embodiments of the chip module 30 of FIG. 3 can be formed along the features and embodiments as described before in connection with the embodiments shown in FIGS. 1 and 2.

Figure 4A:
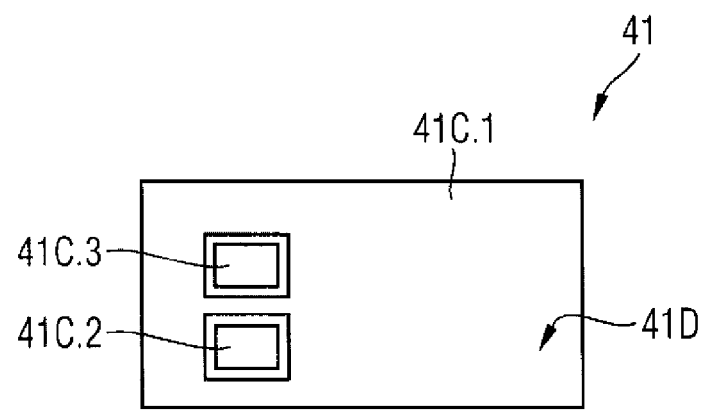
FIGS. 4a-4c show a schematic top view representation of a semiconductor chip according to an embodiment (FIG. 4a), a schematic cross-sectional side view representation of a chip module according to an embodiment (FIG. 4b), and a perspective view of the chip module (FIG. 4c)
Figure 4B:
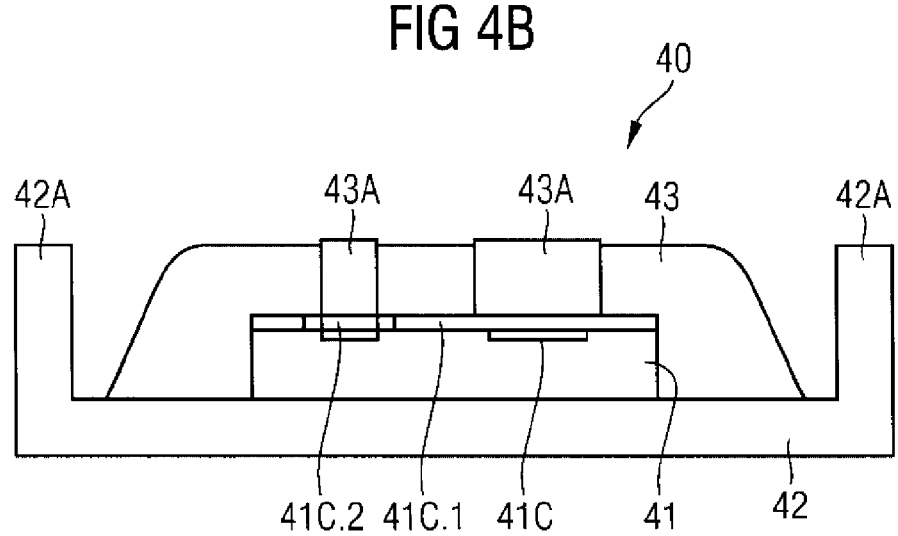
Figure 4C:
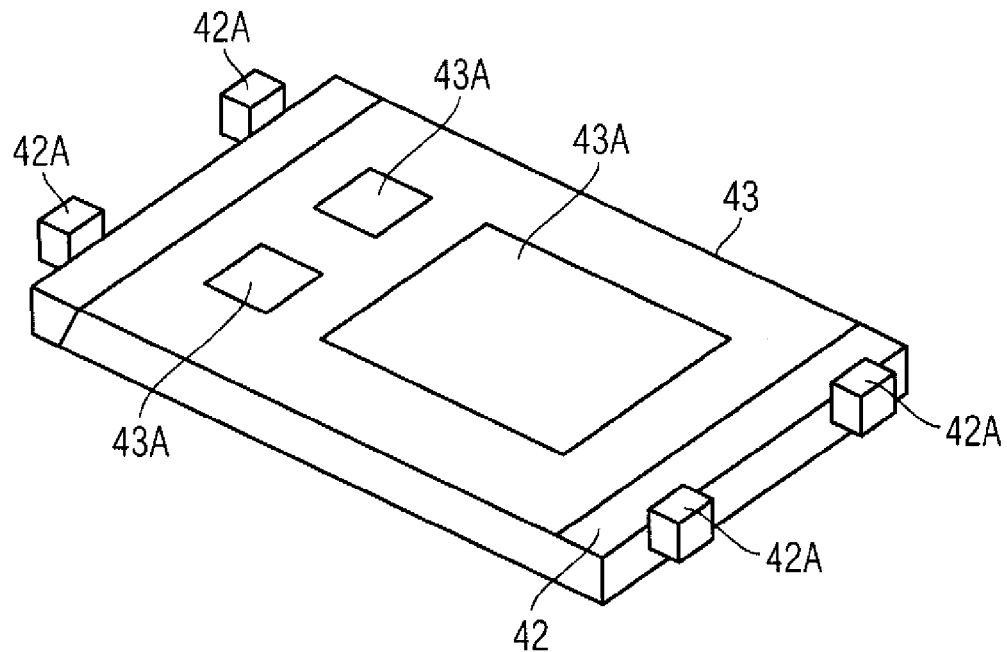

Referring to FIGS. 4a-4c, there are shown a schematic top view representation of a semiconductor chip according to an embodiment (FIG. 4a), a schematic cross-sectional side view representation of a chip module according to an embodiment (FIG. 4b), and a perspective view of the chip module (FIG. 4c). The semiconductor chip 41 of FIG. 4a is shown in a top view on its second surface 41D. The semiconductor chip 41 comprises a vertical transistor structure with contact elements on both of the first main face (not shown) and the second main face 41D. Whereas on the first main face the semiconductor chip 41 comprises a drain contact element (not shown), the second main face 41D comprises a source contact element 41C.1, a gate contact element 41C.2 and a sense contact element 41C.3. The source contact element 41C.1 covers almost the whole second main face 41D of the semiconductor chip 41 besides two areas in which the gate contact element 41C.2 and the sense contact element 41C.3 are located. The gate contact element 41C.2 and the sense contact element 41C.3 are electrically isolated from the source contact element 41C.1 by insulating ring-like regions surrounding each one of the gate contact element 41C.2 and the sense contact element 41C.3.

FIG. 4b shows a schematic cross-sectional side view representation of a chip module 40 comprising the semiconductor chip 41 of FIG. 4a. The cross-sectional view of FIG. 4b shows the semiconductor chip 41 in a plane intersecting gate contact element 41C.2. The chip module 40 comprises a carrier 42 comprising electrical connectors 42A and an insulation layer 43 covering the second surface 41D of the semiconductor chip 41 and portions of the upper surface of the carrier 42 adjacent to side faces of the semiconductor chip 41. The insulation layer 43 comprises electrical through-connectors 43A one of which being connected to the gate contact element 41C.2 and the other one of which being connected to the source contact element 41C.1. The electrical through-connectors 43A are comprised of any sort of solder material and comprise upper exposed electrical surfaces which are coplanar with upper end faces of the electrical connectors 42A of the carrier 42.

The perspective representation of FIG. 4c shows that the carrier 42 comprises four electrical connectors 42A wherein two of them are arranged on either one of two opposing short sides of the leadframe. The electrical connectors 42A were fabricated by bending up small bars of leadframe material in the direction towards the upper surface of the insulation layer with the result that upper end faces of the electrical connectors 42A are situated coplanar with upper end faces of the electrical through-connectors 43A. As a result the chip module can be easily mounted on a PCB board with the end faces of the electrical connectors 42A and the electrical through-connectors 43A facing the PCB board.

Figure 5:
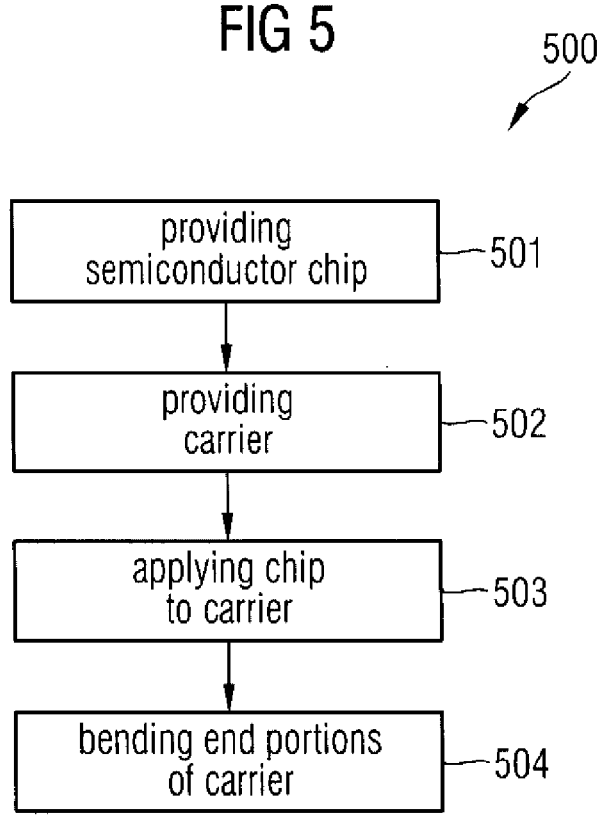
FIG. 5 shows a flow diagram for illustrating a method for fabricating a chip module according to an embodiment.

Referring to FIG. 5, there is shown a flow diagram of a method for fabricating a chip module according to an embodiment. The method 500 comprises providing a semiconductor chip having a first contact element on a first main face and a second contact element on a second main face (501), providing a carrier comprising one or more end portions (502), applying the semiconductor chip to the carrier in such a way that the first main face of the semiconductor chip faces the carrier (503), and bending the one or more end portions of the carrier so that end faces of the end portions become located in a plane above a plane of the semiconductor chip (504).

According to an embodiment of the method of FIG. 5, the method further comprises applying an insulation layer to the second main face of the semiconductor chip. According to a further embodiment thereof, the insulation layer is also applied to the carrier, in particular to portions of an upper surface of the carrier which are situated adjacent to side faces of the semiconductor chip, in particular opposing side faces of the semiconductor chip.

According to a further embodiment, the method further comprises forming an electrical through-connector in the insulation layer, the electrical through-connector being connected to the second contact element of the semiconductor chip and extending through the insulation layer. According to a further embodiment thereof, the insulation layer and the electrical through-connector are formed in such a way that an exposed upper surface of the electrical through-connector is coplanar with an upper surface of the end portion of the carrier.

According to a further embodiment, the insulation layer is formed by one or more of printing or spinning. According to a further embodiment, the material of the insulation layer can be any sort of polymer material, in particular a polyimide material or a photo-sensitive or photo-structurable material like a photoresist material which can be structured by conventional photolithography.

It is worth to note, however, that the step 504 of bending the one or more end portions does not necessarily have to be done at the end of the method. It is also possible that the step 504 of bending is performed before the step 503 of applying the semiconductor chip to the carrier or the applying of the insulation layer.

According to an embodiment of the method of FIG. 5, the method is conducted in such a way so as to fabricate a module as described above in connection with FIG. 1 and in particular a module according to one or more of the embodiments described in connection with FIG. 1.

Figure 6:
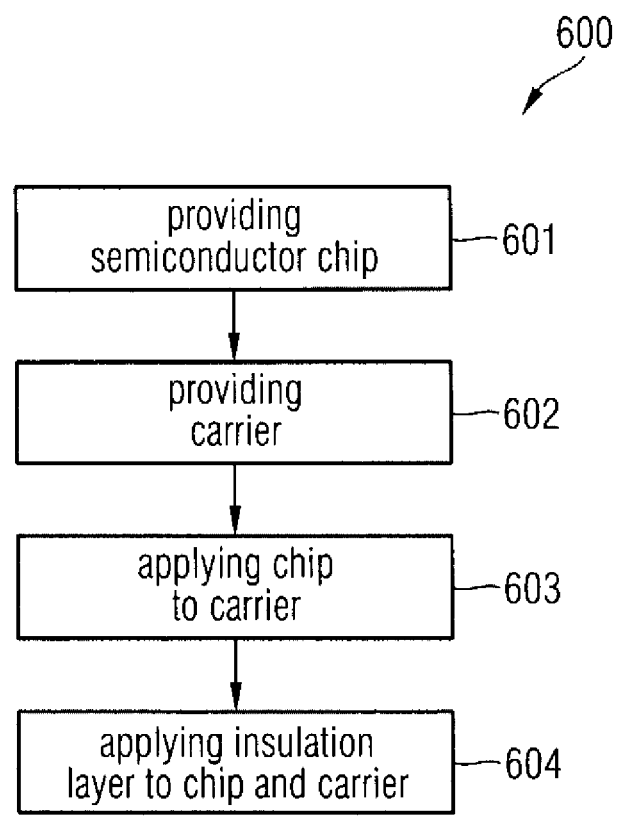
FIG. 6 shows a flow diagram for illustrating a method for fabricating a chip module according to an embodiment.

Referring to FIG. 6, there is shown a flow diagram of a method for fabricating a chip module according to an embodiment. The method 600 of FIG. 6 comprises providing a semiconductor chip having a first contact element on a first main face and a second contact element on a second main face (601), providing a carrier (602), applying the semiconductor chip to a carrier in such a way that the first main face of the semiconductor chip faces the carrier (603), and applying an insulation layer to the second main face of the semiconductor chip and to the carrier (604).

According to an embodiment of the method of FIG. 6, the method further comprises providing the carrier with one or more end portions, and bending the one or more end portions of the carrier so that end faces of the end portions become located in a plane above a plane of the second main face of the semiconductor chip.

According to an embodiment of the method of FIG. 6, the method further comprises forming an electrical through-connector in the insulation layer, the electrical through-connector being connected to the second contact element of the semiconductor chip and extending through the insulation layer. In particular, the electrical through-connector may be formed such that it comprises an upper exposed end face which is coplanar with the end face of the electrical connector of the carrier.

According to an embodiment of the method of FIG. 6, the method is conducted in such a way so as to fabricate a module as described above in connection with FIG. 2 and in particular a module according to one or more of the embodiments described in connection with FIG. 2.

Further embodiments of the method of FIG. 6 can be formed along the features and embodiments as described above in connection with FIG. 5.

Figure 7A:
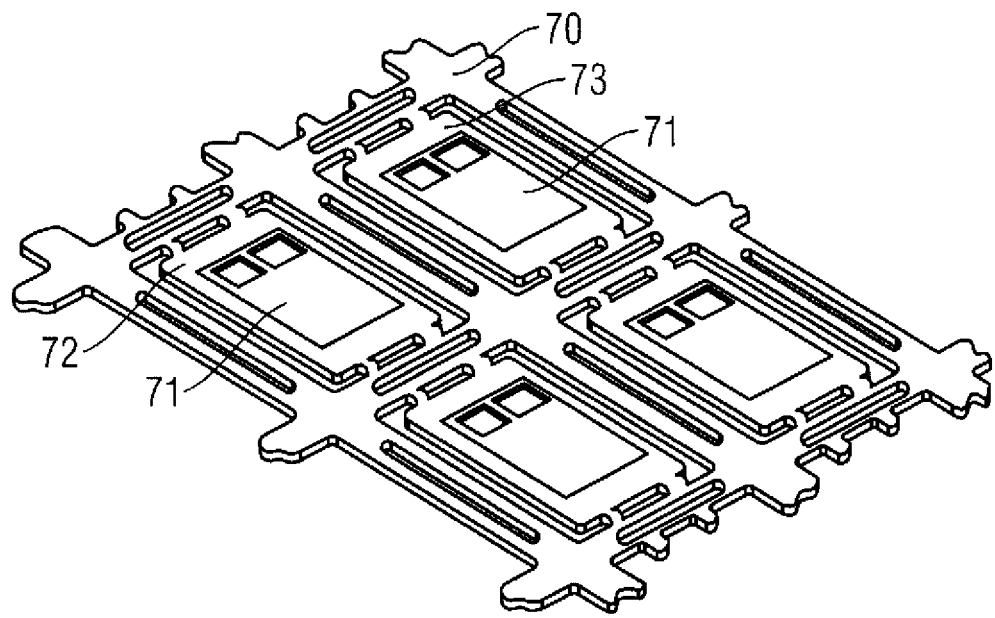
FIGS. 7a and 7b show perspective views of intermediate products for illustrating a method for fabricating a chip module according to an embodiment.
Figure 7B:
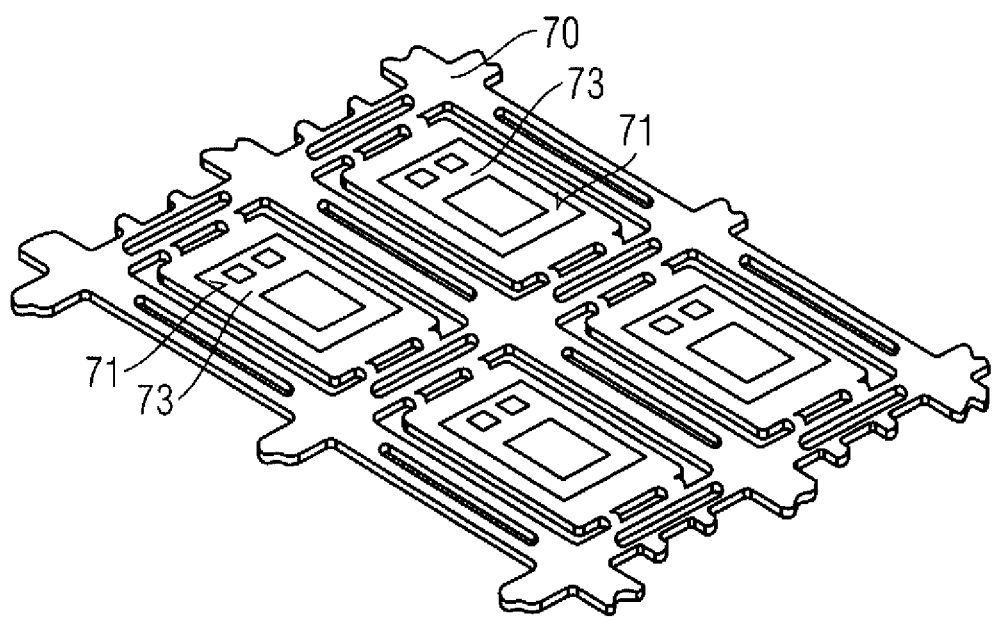

Referring to FIGS. 7a and 7b there are shown perspective views of intermediate products for illustrating a method for fabricating a chip module according to an embodiment. The method comprises providing a base leadframe 70 containing a plurality of single leadframes 72 each one corresponding to leadframe 42 of the chip module 40 shown in FIG. 4. In FIG. 7a a section of this base leadframe 70 is shown which contains only four single leadframes 72 just for reasons of clarity of the drawing. Each one of the single leadframes 72 contains a main body which is connected to opposing long bars of the base leadframe 70. The main body comprises two opposing small side edges each one of which is connected to one of the long bars by two small bars. These two small bars are intended to become the electrical connectors which were shown and designated with reference sign 42A in FIG. 4. In FIG. 7a the base leadframe 70 is shown in a state after attaching semiconductor chip 71 onto the upper surfaces of each one of the main bodies of the single leadframes 72. According to the embodiment shown in FIGS. 7a and 7b, the semiconductor chips 71 have the same form and structure such as that shown in FIG. 4a.

In FIG. 7b the base leadframe 70 is shown after applying an insulation layer 73 over each one of the semiconductor chips 71 and the respective single leadframes. The insulation layer 73 can be applied by printing or spinning as described above. In particular, in case of printing, it is possible, for example, to deliver the material of the insulation layer 73 by means of a print head and to laterally move the base leadframe 70 so that in successive steps each one of the single leadframes 72 having a semiconductor chip 71 attached to it is moved into a position under the print head so that the insulation layer material can be applied to the semiconductor chip 71 and the single leadframe 72. Afterwards the electrical through-connectors are formed into the insulation layer first by forming through-holes into the insulation layer and then by filling the through-holes by an electrically conducting material like tin or any other solder material.

After having processed the single leadframes 72, they are going to be separated from the base leadframe 70 by cutting the small bars at an interface between them and the long bars of the base leadframe 70. In a final step the small bars of each single leadframe 72 will be bent upwards into a form such as that shown in FIG. 4 to become the electrical connectors 42A.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A chip module comprising:
a semiconductor chip having a first contact element on a first main face and a second contact element on a second main face;
a monolithic leadframe comprising a carrier portion and an electrical connector portion, wherein the semiconductor chip is arranged on the carrier portion in such a way that the first main face of the semiconductor chip faces the carrier portion; and
a complete insulation layer arranged on a first side of the monolithic leadframe and not extending to a second side of the monolithic leadframe opposite the first side,
wherein the electrical connector portion comprises an end face located in a plane above a plane of the second main face of the semiconductor chip.

2. The chip module according to claim 1, wherein the electrical connector portion is formed by bending the monolithic leadframe.

3. The chip module according to claim 1, wherein the end face is situated in a plane parallel with the first and second main faces of the semiconductor chip.

4. The chip module according to claim 1, wherein the chip module comprises an even number of electrical connector portions connected to an even number of side faces of the monolithic leadframe in a symmetrical manner.

5. The chip module according to claim 1, further comprising an insulation layer covering the second main face of the semiconductor chip.

6. The chip module according to claim 5, further comprising an electrical through-connector connected to the second contact element of the semiconductor chip and extending through the insulation layer.

7. The chip module according to claim 6, wherein the electrical through-connector comprises an upper exposed surface situated in a horizontal plane above an upper surface of the insulation layer and parallel to the first and second main faces of the semiconductor chip.

8. The chip module according to claim 6, wherein a surface of the electrical through-connector is coplanar with a surface of the electrical connector portion.

9. The chip module according to claim 5, wherein the insulation layer covers the carrier portion.

10. A chip module comprising:
a semiconductor chip having a first contact element on a first main face, a second contact element on a second main face, and side faces connecting the first main face and the second main face;

a carrier, wherein the semiconductor chip is arranged on the carrier in such a way that the first main face of the semiconductor chip faces the carrier;

an insulation layer covering the second main face of the semiconductor chip, the side faces of the semiconductor chip and the carrier; and an electrical connector connected to the carrier, the electrical connector comprising an end face located in a plane above a plane of the second main face of the semiconductor chip, wherein the insulation layer is not in direct mechanical connection with the electrical connector, and wherein a first side face of the carrier parallel to one of the side faces of the semiconductor chip is coplanar with a first side face of the insulation layer and wherein a second side face of the carrier opposite the first side face of the carrier is coplanar with a second side face of the insulation layer.

11. The chip module according to claim 10, further comprising an electrical through-connector connected to the second contact element of the semiconductor chip and extending through the insulation layer.

12. The chip module according to claim 10, wherein the electrical connector is contiguous with the carrier.

13. The chip module according to claim 10, wherein the electrical connector is made of the same material as the carrier.

14. The chip module according to claim 10, wherein the electrical connector comprises a plane end face which is situated in a plane parallel with the first and second main faces of the semiconductor chip.

15. The chip module according to claim 1, wherein the electrical connector comprises four electrical connectors.

16. The chip module according to claim 1, wherein the first contact element is a drain contact element, the second contact element is a source contact element and further comprising:

a gate contact element on the second main face; and a sense contact element on the second main face, wherein the gate contact element and the sense contact element are electrically isolated from the source contact element by insulating regions surrounding each one of the gate contact element and the sense contact element.

17. A chip module comprising:

a semiconductor chip comprising:

a first contact element on a first main face, wherein the first contact element is a drain contact element;

a second contact element on a second main face, wherein the second contact element is a source contact element;

a gate contact element on the second main face; and a sense contact element on the second main face, wherein the gate contact element and the sense contact element are electrically isolated from the source contact element by insulating regions surrounding each one of the gate contact element and the sense contact element;

a carrier, wherein the semiconductor chip is arranged on the carrier in such a way that the first main face of the semiconductor chip faces the carrier; and an electrical connector connected to the carrier, wherein the electrical connector comprises an end face located in a plane above a plane of the second main face of the semiconductor chip, and wherein the electrical connector is an integral part of the carrier.

18. The chip module according to claim 17, further comprising an insulation layer covering the second main face of the semiconductor chip.

* * * * *